United States Patent [19]
Joannopoulos et al.

[11] Patent Number: 5,682,401
[45] Date of Patent: Oct. 28, 1997

[54] RESONANT MICROCAVITIES EMPLOYING ONE-DIMENSIONALLY PERIODIC DIELECTRIC WAVEGUIDES

[75] Inventors: John D. Joannopoulos, Belmont; Shanhui Fan, Cambridge; Pierre R. Villeneuve, Arlington, all of Mass.; Robert D. Meade, Westfield, N.J.

[73] Assignee: Massachusetts Institute of Technology, Cambridge, Mass.

[21] Appl. No.: 665,529

[22] Filed: Jun. 18, 1996

Related U.S. Application Data

[63] Continuation of Ser. No. 318,161, Oct. 5, 1994, abandoned.

[51] Int. Cl.$^6$ .................................................. H01S 3/08
[52] U.S. Cl. ............................ 372/96; 372/92; 372/99; 385/129
[58] Field of Search ............................ 372/96, 49, 99, 372/92, 50; 385/129, 131

[56] References Cited

U.S. PATENT DOCUMENTS

| | | |
|---|---|---|
| 4,015,893 | 4/1977 | Sugano et al. |
| 4,503,447 | 3/1985 | Iafrate et al. |
| 4,591,889 | 5/1986 | Gossard et al. |
| 4,799,749 | 1/1989 | Börner et al. |
| 4,817,102 | 3/1989 | Maurer et al. |
| 4,955,036 | 9/1990 | Mozer ............................ 372/96 |
| 4,983,540 | 1/1991 | Yamaguchi et al. |
| 4,999,682 | 3/1991 | Xu et al. |
| 5,079,594 | 1/1992 | Mitsuyu et al. |
| 5,126,804 | 6/1992 | Nagai et al. |
| 5,155,567 | 10/1992 | Haga et al. |
| 5,166,826 | 11/1992 | Ruprecht. |
| 5,172,267 | 12/1992 | Yablonovitch. |
| 5,187,461 | 2/1993 | Brommer et al. |
| 5,210,801 | 5/1993 | Fournier et al. |
| 5,236,547 | 8/1993 | Takahashi et al. |
| 5,253,262 | 10/1993 | Kurobe et al. ............................ 372/96 |
| 5,301,204 | 4/1994 | Cho et al. ............................ 372/50 |
| 5,332,681 | 7/1994 | Tonucci et al. |
| 5,335,240 | 8/1994 | Ho et al. ............................ 372/39 |
| 5,389,943 | 2/1995 | Brommer et al. ............................ 343/909 |
| 5,440,421 | 8/1995 | Fan et al. ............................ 359/344 |

FOREIGN PATENT DOCUMENTS

| | | |
|---|---|---|
| WO-A-9215124 | 9/1992 | WIPO. |
| WO-A-9416345 | 7/1994 | WIPO. |

OTHER PUBLICATIONS

Chavez–Pirson et al., "Polarization properties of a vertical cavity surface emitting laser using a fractional layer superlattice gain medium", Appl. Phys. Lett., vol. 62, No. 24, 14 Jun. 1993, pp. 3082–3084.

A Physical Review, R.P. Stanley et al., "Impurity modes in one–dimensional periodic systems: The transition from photonic band gaps to microcavities". Sep. 1993, New York: p. 2246.

Applied Physics Letters, P.R. Villeneuve et al., "Air–bridge microcavities". Jul. 1995, New York: pp. 167–169.

(List continued on next page.)

*Primary Examiner*—Rodney B. Bovernick
*Assistant Examiner*—Yisun Song
*Attorney, Agent, or Firm*—Samuels, Gauthier, Stevens & Reppert

[57] ABSTRACT

The present invention provides a resonant microcavity which includes a periodic dielectric waveguide, and a local defect in the periodic dielectric waveguide which accommodates spacial confinement of radiation generated within the waveguide around the defect. In an alternative embodiment, the present invention provides a method of enhancing radiation confinement within a resonant microcavity and minimizing radiation losses into an associated substrate, the microcavity configured within a periodic dielectric waveguide as a local defect which exhibits spacial radiation confinement, the method including the step of increasing the refractive index contrast between the microcavity and the substrate.

32 Claims, 8 Drawing Sheets

OTHER PUBLICATIONS

Applied Physics Letters, Seto M. et al., "GAAS.ALGAAS Single–Mode Optical Waveguides with Low Propagation Loss and Strong Optical Confinement". Mar. 1990, pp. 990–992.

Journal of Applied Physics, R.D. Meade et al., "Novel applications of photonic band gap materials: Low–loss bends and high Q cavities". May 1994, New York: pp. 4753–4755.

Journal of The Optical Society of America, S. Fan et al., "Guided and defect modes in periodic dielectric waveguides". Jul. 1995, New York: pp. 1267–1271.

Patent Abstracts of Japan, vol. 012 No. 072 (E–588), Mar. 1988 & JP.A.62 213288, Sep. 1987.

Physical Review Letters, E. Yablonovitch et al., "Donor and acceptor modes in Photonic band structure". Dec. 1991, New York: pp. 3380–3383.

Hecht, Jeff, "Long–Wavelength Diode Lasers are Tailored for Fiberoptics", Laser Focus World, Aug. 1992, pp. 79–89.

Ho, K.M., C.T. Chan, C.M. Soukoulis, R. Biswas and M. Sigalas, "Photonic Band Gaps in Three Dimensions: New Layer–By–Layer Periodic Structures", Solid State Communications, vol. 89, No. 5, 1994, pp. 413–416. no month available.

Jewell, Jack L., James P. Harbison and Axel Scherer, "Microlasers", Scientific American, Nov. 1991, pp. 86–94.

Kleinman, Leonard and D.M. Bylander, "Efficacious Form for Model Pseudopotentials", Physical Review Letters, vol. 48, No. 20, May 17, 1982, pp. 1425–1428.

Lee, T.P., "Diode–Laser Developers Look to Broadband Optical Communications", Laser Focus World, Aug. 1989, pp. 129–133.

Meade, Robert D., A. Devenyi, J.D. Joannopoulos, O.L. Alerhand, D.A. Smith and K. Kash, "Novel Applications of Photonic Band Gap Materials: Low–Loss Bends and High Q Cavities", J. Appl. Phys., vol. 75, No. 9, May 1, 1994, pp. 4753–4755.

Özbay, E., E. Michel and G. Tuttle, R. Biswas, M. Sigalas and K.M. Ho, "Micromachined Millimeter–Wave Photonic Band–Gap Crystals", Appl. Phys. Lett., vol. 64, No. 16, Apr. 18, 1994, pp. 2059–2061.

Slusher, R.E., "Semiconductor Microlasers and Their Applications", Optics & Photonics News, Feb. 1993, pp. 8–17.

Sözüer, H.S. and Jonathan P. Dowling, "Photonic Band Calculations for Woodpile Structures", Journal of Modern Optics, vol. 41, No. 2, Feb. 1994, pp. 2–8 + drawings.

Sözüer, H. Sami and Joseph W. Haus, "Photonic Bands: Simple–Cubic Lattice", J. Optical Society of American B., vol. 10, No. 2, Feb. 1993, pp. 296–302.

Wendt, J.R., G.A. Vawter, P.L. Gourley, T.M. Brennan and B.E. Hammons, "Nanofabrication of Photonic Lattice Structures in GaAs/AlGaAs", J. Vac. Sci. Technol. B., vol. 11, No. 6, Nov/Dec 1993, pp. 2637–2640.

Yablonovitch, E., T.J. Gmitter and K.M. Leung, "Photonic Band Structure: The Face–Centered–Cubic Case Employing Nonspherical Atoms", Physical Review Letters, vol. 67, No. 17, Oct. 21, 1991, pp. 2295–2298.

RESONANT MICROCAVITIES EMPLOYING ONE-DIMENSIONALLY PERIODIC DIELECTRIC WAVEGUIDES

This is a continuation of application Ser. No. 08/318,161 filed on Oct. 5, 1994, now abandoned.

This invention was made with government support under Contract Number DAAH04-93-G-0262 awarded by the Army, and Grant Number 9022933-DMR awarded by the National Science Foundation. The government has certain rights in the invention.

BACKGROUND OF THE INVENTION

The invention relates to resonant microcavities employing one-dimensional periodic dielectric waveguides.

In the past decades, the semiconductor laser has come to play a critical role in numerous applications including optical information storage and retrieval (e.g. CD players), lightwave communication (e.g. optical fibers), and computer input/output. Typical semiconductor lasers are nearly 200 µm in length and the lateral mode area is approximately one square micron. This results in nearly 100 longitudinal modes within the spectral bandwidth of the laser gain medium. As a result, many modes can reach lasing threshold, leading to multimode oscillations. In order to increase the relative gain differences between the various modes, a frequency-selective loss can be introduced by building a corrugated structure inside the laser cavity. The modes closest to the Bragg wavelength of the grating will have the lowest losses and will build up. This is known as a distributed feedback (DFB) laser.

Single-frequency lasing can be obtained by incorporating a phase shift (or defect) in the grating of the DFB laser, as shown in FIG. 1A. FIG. 1A shows a cross-sectional view of a DFB laser 100 with a single phase slip 102 at the center. The DFB laser is configured with a substrate 104 and a grating layer 106 made with two dielectric materials. The grating pattern includes the aforementioned single phase slip or defect. A gain region 108 with impurity atoms and a cladding layer 110 for isolation are also provided. Although the phase shift has the effect of confining the field around the defect, the confinement is very weak, as shown in FIG. 1B. FIG. 1B shows a plot of the intensity as a function of the axial position in the DFB laser. The parameter κL is known as the coupling parameter and increases as a function of the depth of the corrugation. The intensity is in arbitrary units.

Mirrors of a DFB laser (or any semiconductor laser) are normally formed simply by cleaving the end faces of the crystal. The two faces are cleaved along the same crystallographic planes which results in a parallel-plane resonator which is at the limit of the geometric stability conditions of lasers. This partly accounts for the typical lack of stability of the output mode in semiconductor lasers. Furthermore, each interface between the semiconductor and air has roughly a 30% reflectivity. These high losses, in conjunction with the large dimensions of the laser, result in very large input thresholds required to operate semiconductor lasers. In order to increase the reflectivity at each interface, multilayer dielectric films can be deposited on the end faces. However, this process involves laborious and expensive manipulations since each laser must be separated from the others and direct integration on a substrate becomes impossible.

In order to solve most of these problems, researchers have developed laser cavities whose dimensions are on the order of the wavelength of the emitted light. These microcavities have dimensions of microns or fractions of microns. The first such device was introduced in the late 1980's. It is called the vertical cavity surface emitting laser (VCSEL) 200 and is shown in FIG. 2A. It is made of two multilayer dielectric quarterwave mirrors 202, 204 separated by a material 206 of index n and thickness $\lambda/n$. The gain medium is often made of one or several quantum wells 207 placed in the layer of index n at the peak of the resonant mode electric field. For wavelengths around 1 and 1.5 µm, typical dimensions are 5–10 µm in diameter and several microns in height. Although there is only one longitudinal mode within the gain spectral bandwidth, there are other modes in the plane of the gain region transverse to the axis of the VCSEL. Furthermore, the overlap of the resonant mode and the gain quantum layer is very low since the field extends deeply into the multilayer mirrors. In spite of the advantages of the VCSEL over typical semiconductor lasers, the most significant drawback of these devices is their vertical position and vertical emission 208 on the substrate which limits significantly their usefulness in optoelectronic integrated circuits (OEICs).

Another microlaser design was introduced in the early 1990's and is known as the microdisk laser 210 as shown in FIG. 2B. As its name indicates, it is made of a small high-index disk 212 supported by a post 214. The disk diameter is typically between 2 and 10 µm and its thickness is around 0.25 µm. The gain medium is made of one or several quantum layers 217 placed in the center of the disk. Since the resonant mode 216 can be strongly confined in the disk, its overlap with the gain material can be much larger than that of the VCSEL. The dominant-resonant mode is called a whispering-gallery mode since it propagates around the edge of the disk with low losses due to total internal reflection. However, the resonant mode can "leak out" anywhere along the edge of the disk. This limits significantly the coupling efficiency of the microdisk since only a small fraction of the output light can be coupled into a waveguide.

Although the fabrication of the microdisk does not require the growth of several dielectric layers, which should make its fabrication easier than that of the VCSEL, the resonant imperfections can significantly affect the whispering-gallery mode and reduce the lasing efficiency of the microdisk. The lasing efficiency is further reduced by: the presence of two counter-propagating modes at the disk edge which competes for spontaneous emission, by the presence of external modes propagating orthogonally through the disk which may overlap the emission spectrum and compete with the lasing mode for spontaneous emission, and by the emission from the central region of the disk.

SUMMARY OF THE INVENTION

The present invention provides a resonant microcavity which includes a periodic dielectric waveguide, and a local defect in the periodic dielectric waveguide which accommodates spacial confinement of radiation around the defect.

In an alternative embodiment, the present invention provides a method of enhancing radiation confinement within a resonant microcavity and minimizing radiation losses into an associated substrate, the microcavity configured within a periodic dielectric waveguide as a local defect which exhibits spacial radiation confinement, the method including the step of increasing the refractive index contrast between the microcavity and the substrate.

The present invention provides a new class of resonant microcavities which combine the best features of all the state-of-the-art integrated resonant cavities into one. These new microcavities contain an electromagnetic mode whose field is very strongly confined within the cavity. They are integrated in the plane of the substrate which allows for direct coupling into optoelectronic integrated circuits without the need of any additional devices. The microcavities will allow for the fabrication of high density and high speed optical interconnects, ultra-low threshold microlasers and LED's, and will also allow for the enhancement of spontaneous emission. They employ one-dimensional periodic dielectric waveguides to confine light along all three dimensions in space.

The microcavities of the present invention contain an electromagnetic mode which can lead to very high quantum efficiencies since all the spontaneous emission will be funneled into just one mode. These new microcavities also give rise to strong field confinement within the cavities. The overlap of the resonant mode and the gain medium should be very large and should lead to the enhancement of spontaneous emission. By concentrating the electric field fluctuations into a small volume, the recombination rate of carriers is increased allowing the microcavities to be modulated at very high speeds.

Furthermore, the microcavity design of the present invention is very small, hence a large number of them can be integrated onto a single optical chip. Their small size combined with their high efficiency will allow them to be operated at very low thresholds. Yet one of the most significant advantages of the microcavities of the present invention is their ability to be integrated directly into OEICs. The devices allow light to be coupled directly in and out of a waveguide with very high degrees of efficiency. In addition, deviations arising in the fabrication process should not affect significantly their efficiency. Finally, even without the presence of gain in these devices, they would still behave as single mode thresholdless light-emitting diodes. Either with or without gain, the devices could be pumped optically or electrically.

DETAILED DESCRIPTION OF THE ILLUSTRATED EMBODIMENTS

The resonant microcavities of the present invention are formed by using a conventional planar optical waveguide geometry with a strong periodic variation of the dielectric constant along the axial direction of the waveguide. As described above, the microcavities have dimensions of microns or fractions of microns. The planar resonant microcavities allow for in-plane coupling along the surface of a substrate on which it is constructed.

Figure 1A:
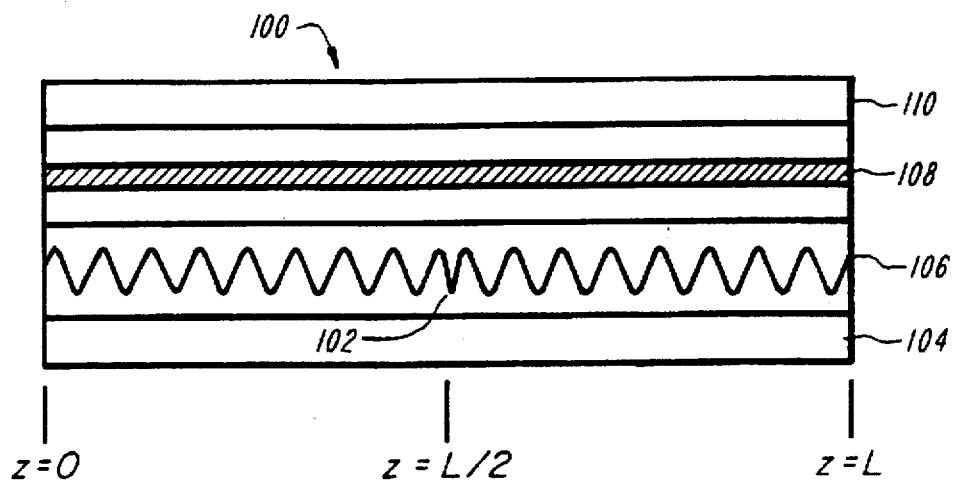
FIGS. 1A and 1B respectively show a cross-sectional view of a conventional DFB laser with a single phase defect at the center, and a plot of the intensity as a function of the axial position in the DFB laser.
Figure 1B:
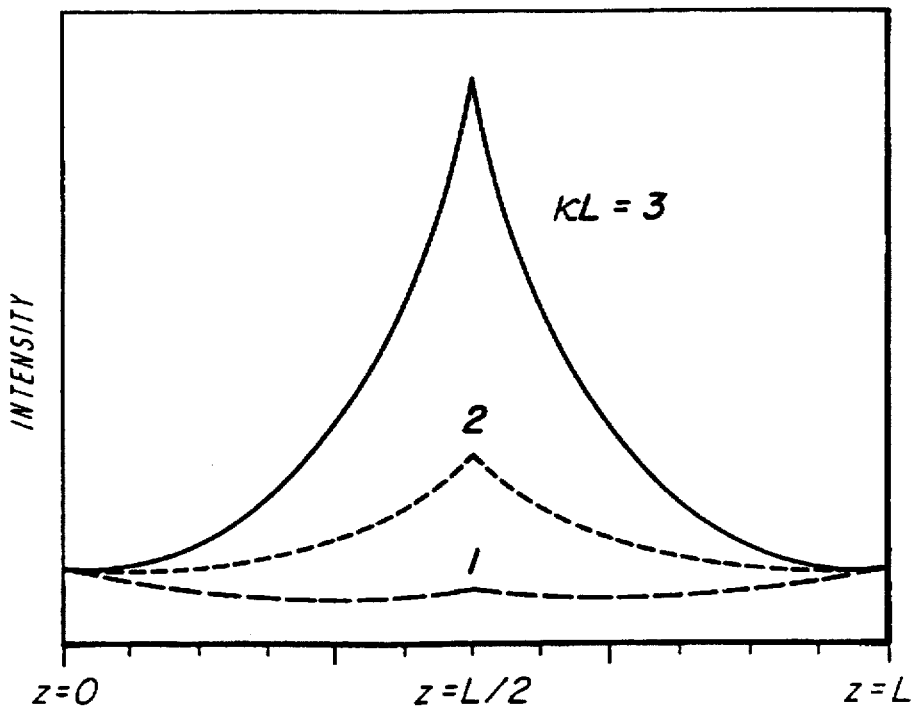
Figure 2B:
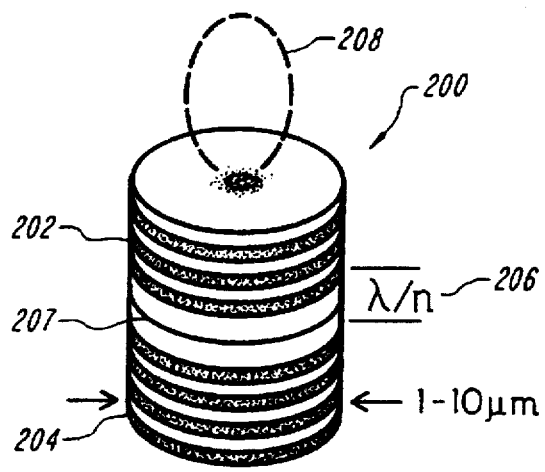
FIGS. 2A an 2B respectively show a conventional vertical cavity surface emitting laser, and a conventional microdisk laser construction.
Figure 2B:
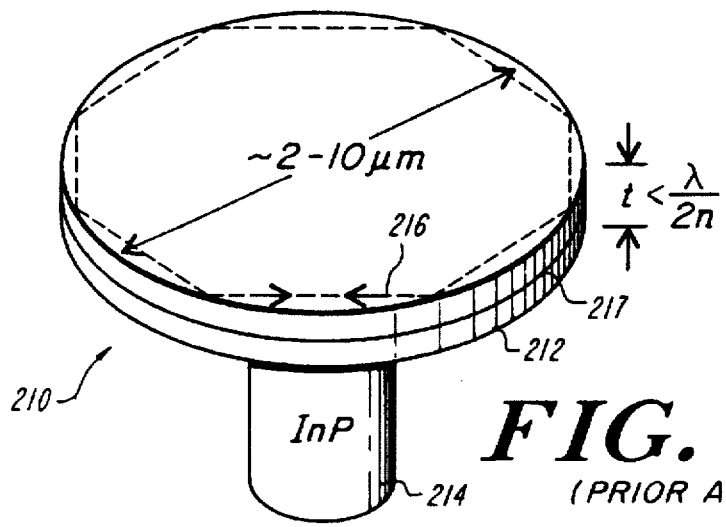
Figure 3A:
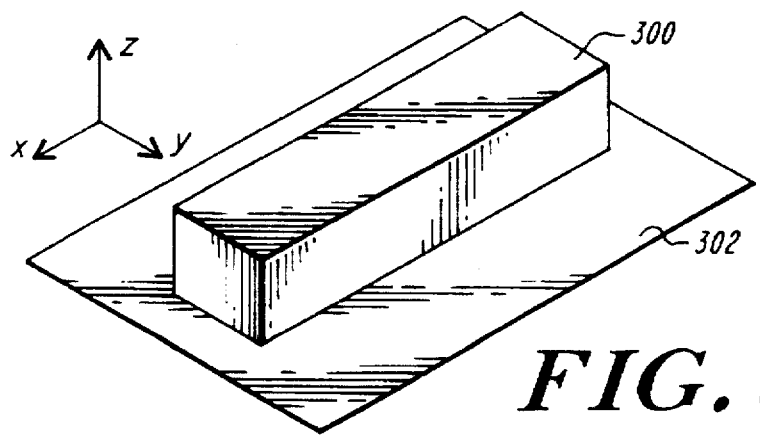
FIG. 3A shows a conventional rib waveguide on a substrate.

For simplicity of illustration, a conventional rib waveguide 300 is shown in FIG. 3A. The waveguide is made of one or more layers of a high-index of refraction material, which lies on a substrate 302 with a lower refractive index. The waveguide confines the radiation along both the y and z directions. Radiation can be further confined along the x direction by adding a periodic variation of the dielectric constant along that axis. The microcavity is formed by breaking the perfect periodicity along the x-axis hence forming a local defect which can lead to strong spacial confinement of the radiation around the defect in order to generate a single electromagnetic mode. It will be appreciated that multimode operations are possible with the same device configuration. The electromagnetic mode is localized around the defect within a few periodic distances. Local defects can be made, for example, by putting a phase shift in the periodic structure along the x-axis or by adding a different material locally in the waveguide.

Figure 3B:
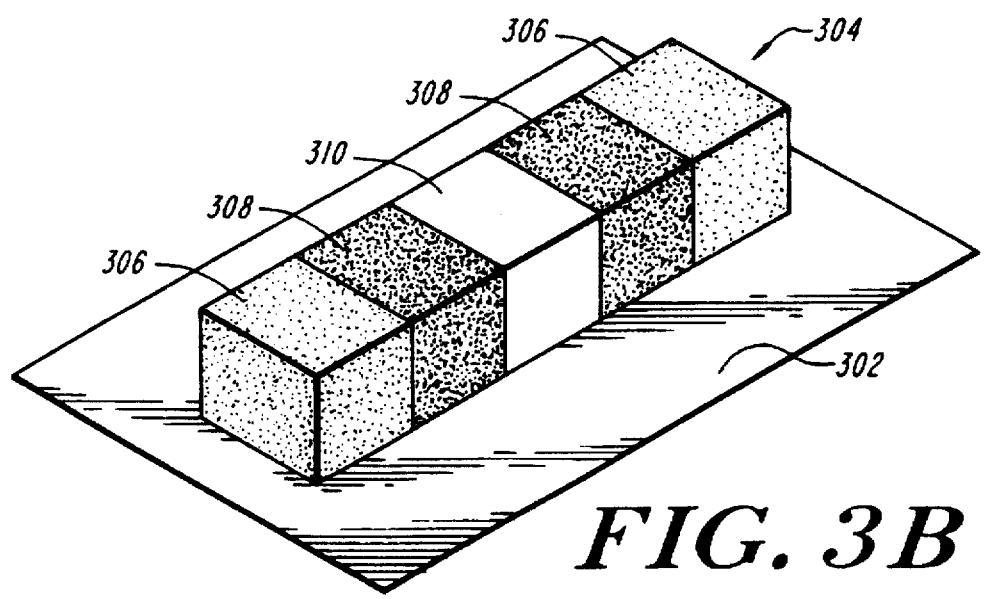
FIG. 3B shows a one-dimensional periodic dielectric microcavity in accordance with the present invention.

The waveguide microcavity 304 in accordance with the present invention is shown in FIG. 3B. The one-dimensional periodic structure is depicted by the alternating dielectric regions 306, 308 along the x-axis and the defect 310 is shown in a central location. In order to get good radiation confinement into the microcavity (i.e. minimum leakage into the surrounding medium) it is essential that the index contrast between the waveguide 304 and the substrate 302 be as large as possible. Si waveguides on a $SiO_2$ substrate would offer excellent index contrasts. Other materials such as GaAs and AlGaAs can be used in the fabrication of the waveguides but they would need to be grown on a substrate with a low dielectric constant. Ge waveguides on a GaAs substrate could also be used but the index contrast would be smaller.

Figure 3C:
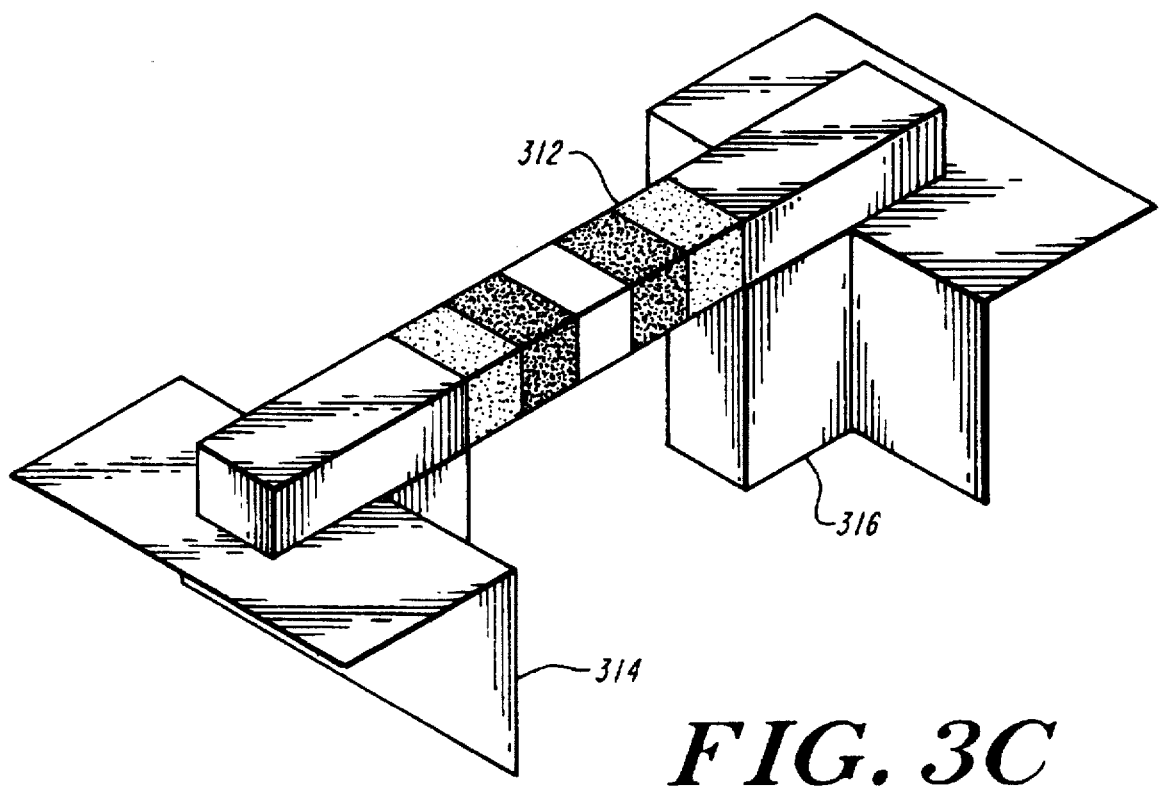
FIG. 3C shows the waveguide microcavity of FIG. 3B in a bridge configuration in accordance with the present invention.

One particularly advantageous technique of increasing the index contrast is to suspend a waveguide 312 with alternating dielectric index materials in air in such a manner that the microcavity is completely surrounded by air as shown in FIG. 3C. The "air bridge" suspension can be achieved by the use of fabricated support members 314, 316 described in more detail hereinafter. This suspension has the effect of minimizing the radiation losses into the substrate.

Figure 4A:
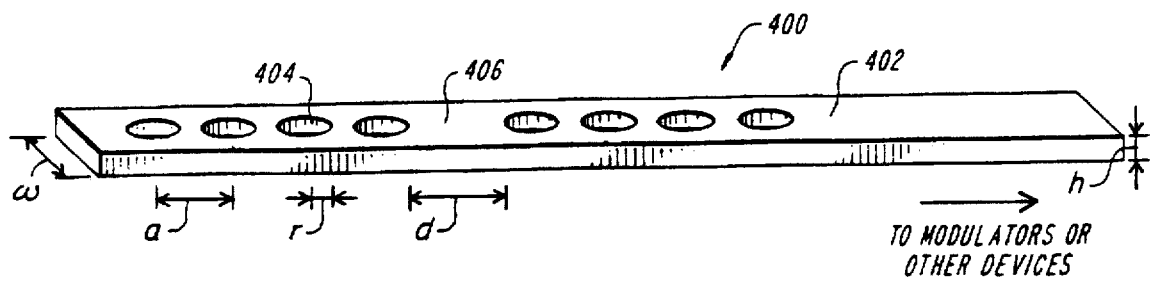
FIGS. 4A and 4B respectively show an alternative embodiment of a waveguide microcavity positioned on a substrate and in a bridge configuration in accordance with the present invention.

More specific embodiments of the waveguide microcavities of the present invention are now described. An exemplary embodiment of a microcavity 400 is shown in FIG. 4A. The microcavity is fabricated by creating a periodic array of holes 404 into the top surface of a rib waveguide 402. The rib waveguide can be made of one or more layers of different materials. A local defect 406 is added by separating two of the holes by a distance larger than that which separates the other holes.

In this exemplary embodiment, the cross-section of the holes is circular, however, other configurations are possible. The different parameters of this microcavity are: the width w and height h of the rib waveguide, the radius r of the holes, the distance a from center to center of each hole, the size d of the defect, and the number of holes on each side of the defect. Since the microcavity can be scaled to any wavelength simply by scaling these parameters, it is convenient to choose one of the parameters and scale every other with respect to it. In the exemplary embodiment illustrated, every parameter is chosen to be scaled with respect to a.

Figure 4B:
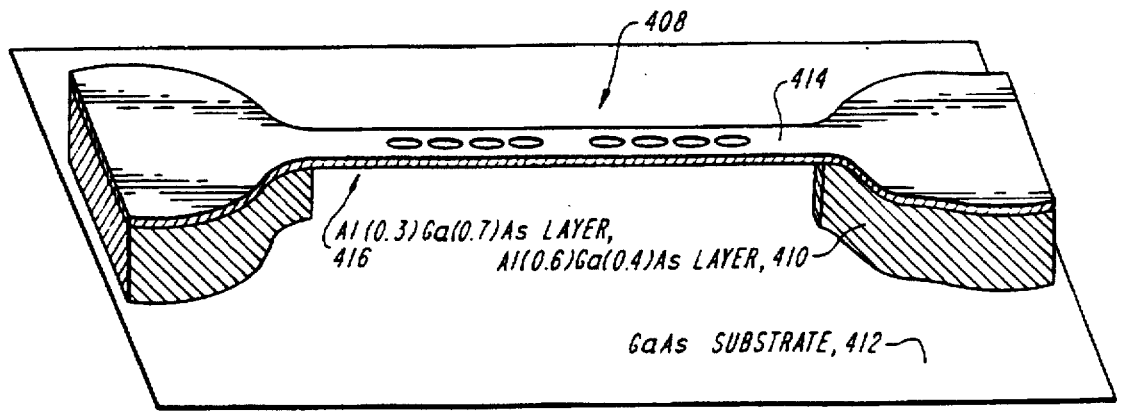
Figure 4C:
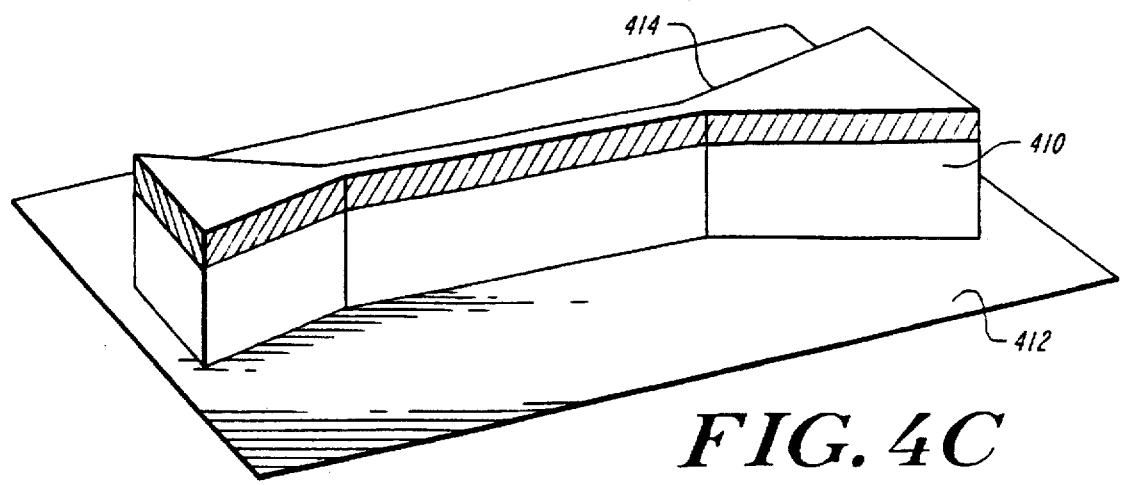
FIGS. 4C and 4D show two steps of fabrication process of the bridge configuration of FIG. 4B.
Figure 4D:
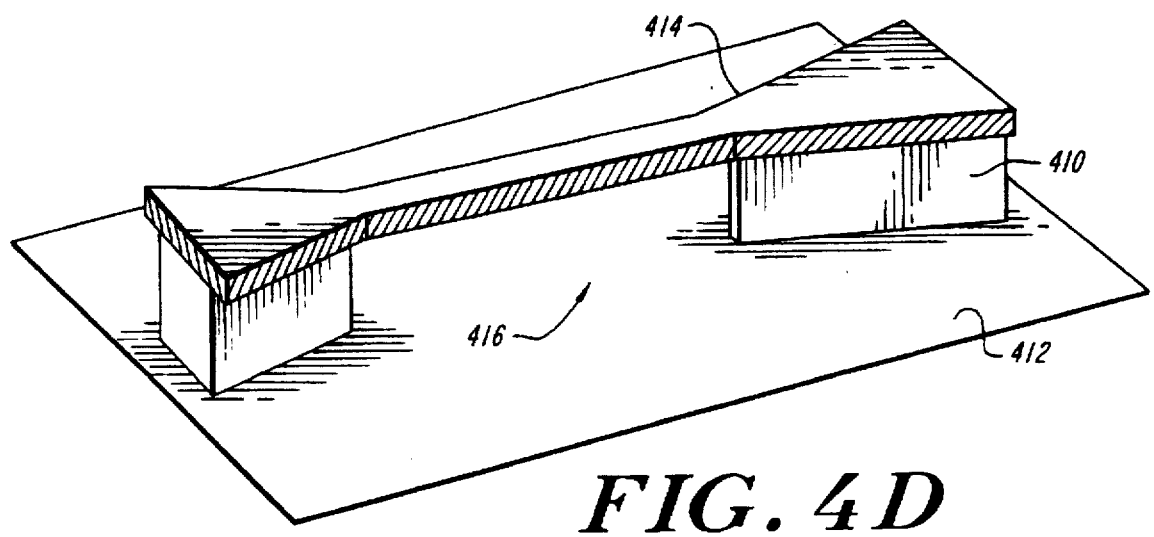

The waveguide of the present invention is grown directly onto a substrate, but the radiation leakage into this substrate will reduce the confinement efficiency of the microcavity. In order to minimize these losses, it is desirable to reduce the contact area and increase the index contrast between the microcavity and the substrate. As mentioned above, one way of increasing the index contrast is to suspend the microcavity in air. A specific exemplary embodiment of a microcavity 408 is shown in FIG. 4B using fabricated layers of GaAs and AlGaAs. A layer 410 of $Al_{0.6}Ga_{0.4}As$ is grown on a GaAs substrate 412, and thereafter a waveguide 414 is then grown over this layer using $Al_{0.3}Ga_{0.4}As$. By selectively etching away the $Al_{0.6}Ga_{0.4}As$ from-under the microcavity leaving space 416, the microcavity itself is suspended in air. One exemplary method of fabricating space 416 is shown in FIGS. 4C and 4D. Layers 410 and 414 are grown on the substrate 412 and both layers are etched as shown in FIG. 4C where the ends are wider than the center. Layer 410 is selectively etched away until the central part is entirely removed, leaving space 416 as shown in FIG. 4D. The ends of waveguide 414 can then be tapered down to any shape with an additional etching step. Although the illustrated example utilizes GaAs and AlGaAs in FIG. 4B, it will be appreciated by those of skill in the art that the bridge configuration can alternatively be made with any material strong enough to support itself. For example, a Si waveguide on $SiO_2$ is another alternative material construction.

Figure 4E:
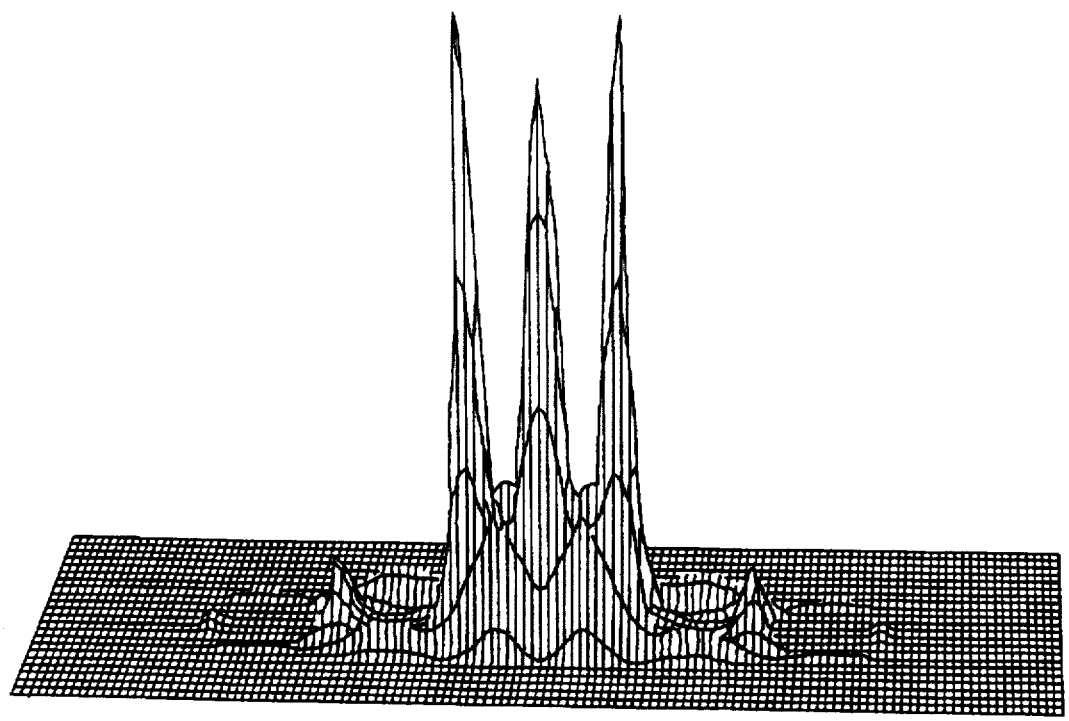
FIGS. 4E and 4F show computed power graphs as a function of position.
Figure 4F:
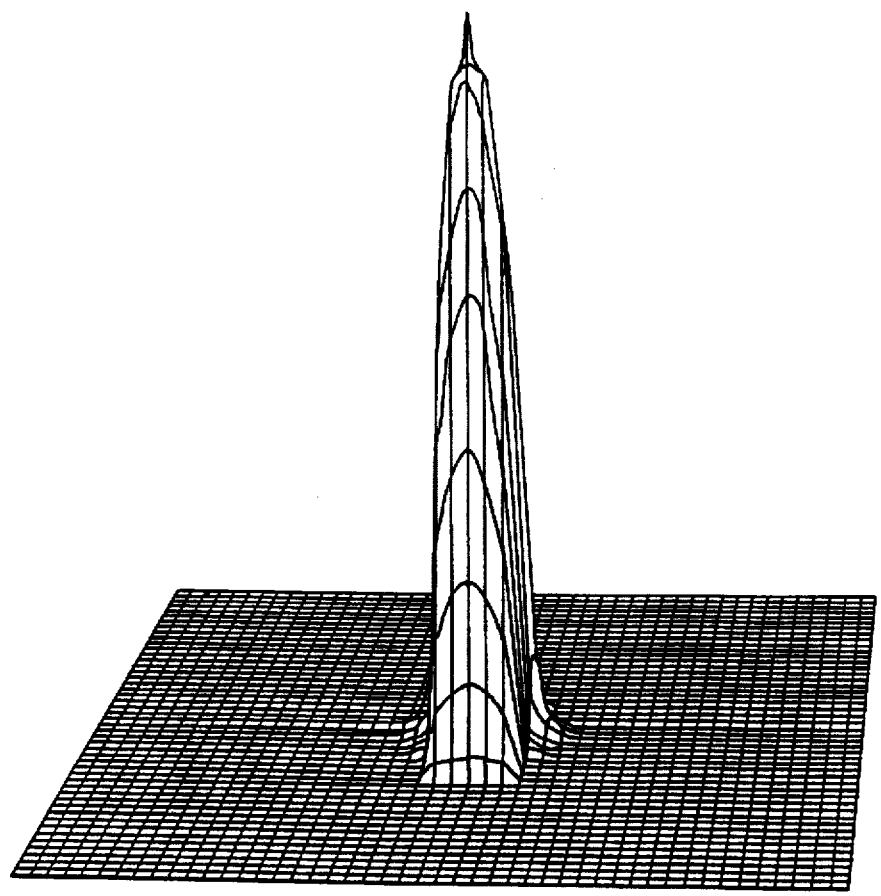

The bridge configuration accommodates very high degrees of confinement within the microcavity along every direction. FIGS. 4E and 4F respectively show exemplary graphs of the computed power of the resonant mode in the suspended microcavity as a function of position in the xy-plane (at z=0) and the yz-plane (at x=0). The coordinate system is centered in the defect. The exemplary waveguide microcavity was assumed to be made of a material with a dielectric constant of 12.096 with the following parameters: w=1.1a, h=0.4a, r=0.3a and d=1.9a, where d is the distance from center to center of the holes on either side of the defect. Furthermore, three and a half holes on either side of the defect were used in the illustrated computations. In the specific case where the microcavity is operated at a wavelength of 1.5 μm, the lattice constant a would be equal to 0.5 μm.

Figure 5A:
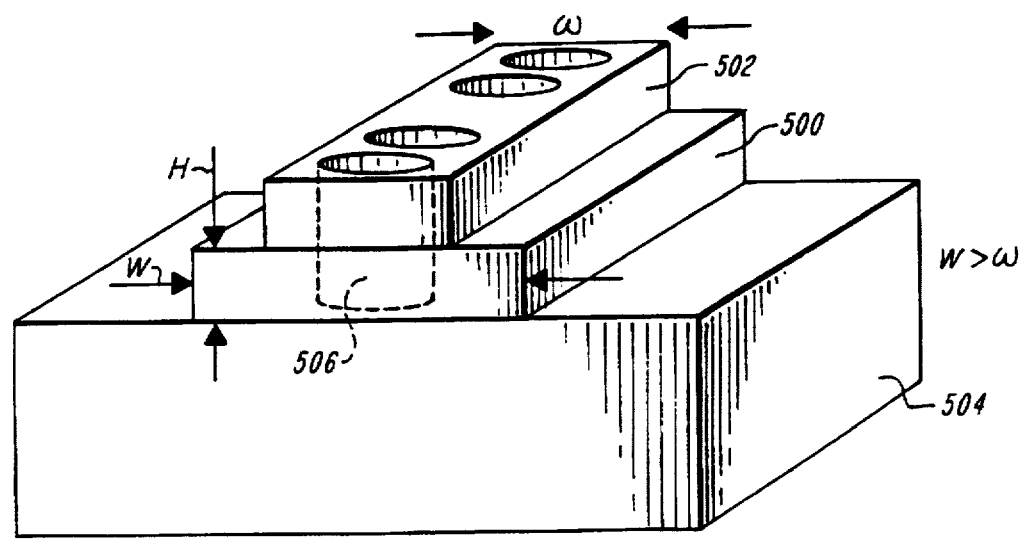
FIGS. 5A and 5B respectively show a waveguide microcavity and substrate configured with a dielectric layer therebetween, the layer having a width which is greater than that of the microcavity, and a width which is smaller than that of the microcavity.
Figure 5B:
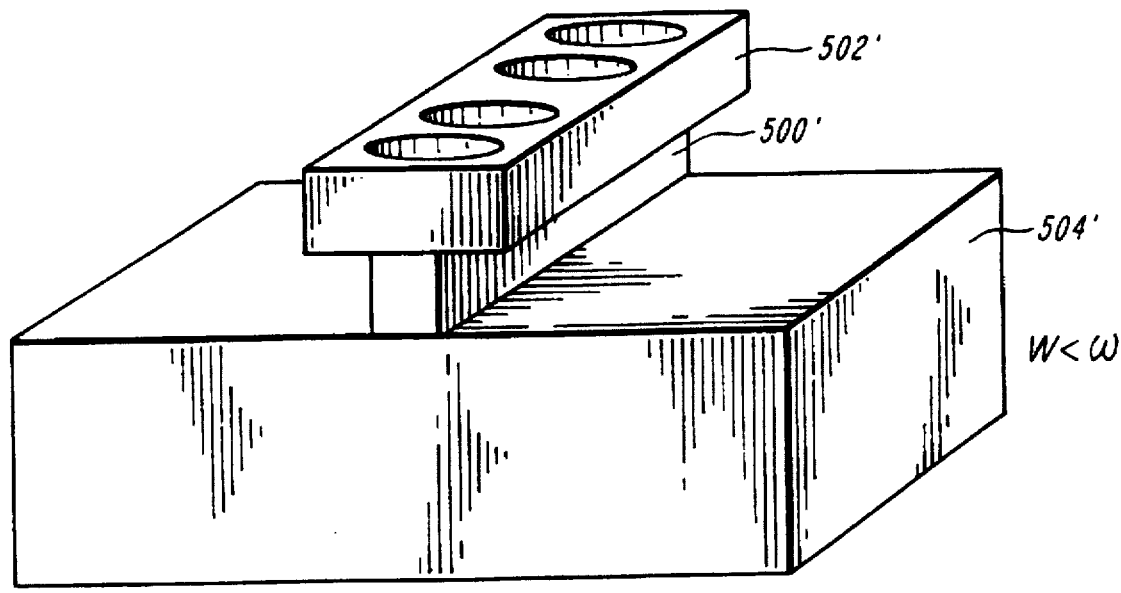
Figure 5C:
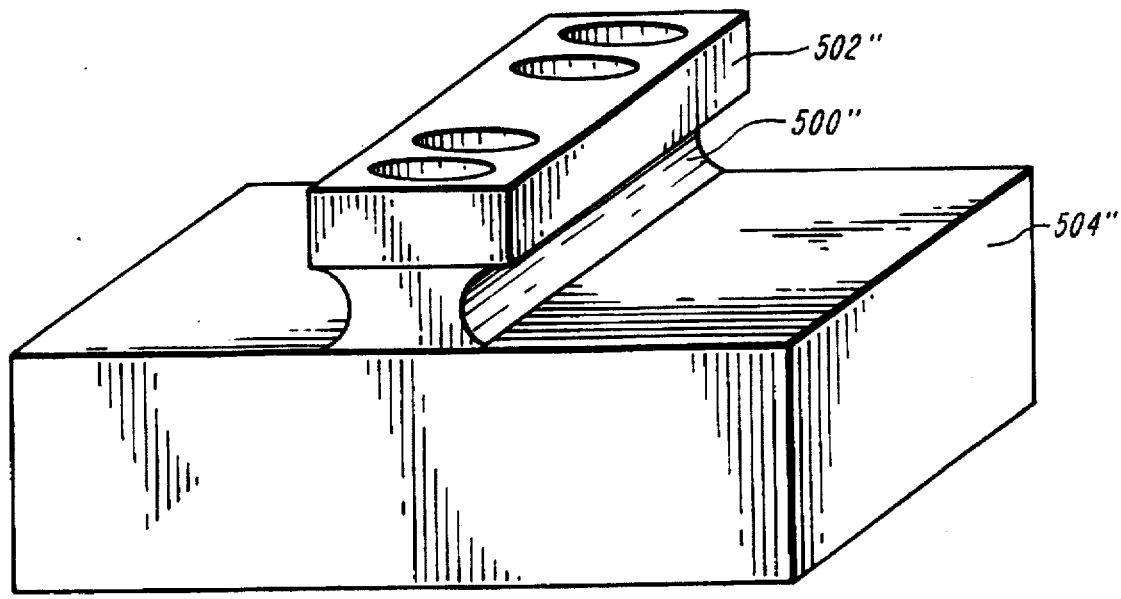
FIG. 5C shows a microcavity fabricated by etching away part of the dielectric layer.

Another technique of the present invention to reduce the losses into the substrate is to grow an extra dielectric layer between the substrate and the microcavity. Several exemplary embodiments of this design are shown in FIGS. 5A–5C. The thickness H and the width W of the additional layer can be adjusted in order to minimize radiation leakage into the substrate. In FIG. 5A, a dielectric layer 500 is positioned between a waveguide microcavity 502 and substrate 504. The width of the layer 500 is greater than that of the waveguide, whereas the width of the layer 500' is smaller in the configuration of FIG. 5B.

One technique of fabricating the microcavity shown in FIG. 5B is to grow the dielectric layer 500' onto the substrate 504' and then grow the waveguide microcavity 502' onto the layer 500'. By selectively etching part of the dielectric layer from underneath the waveguide, the resulting device is shown in FIG. 5C. Although the dielectric layer 500" is preferably made out of a different material (with a smaller dielectric constant) than that of the substrate 504", it can also be made of the same material. Since materials like Si and GaAs are often used as substrates and since these materials have high dielectric constants, it becomes necessary to separate the microcavity from the substrate with a material of smaller dielectric constant.

Another alternative technique of increasing the radiation confinement into the microcavity is to increase the depth of each hole 506 through the waveguide 502 and into the dielectric layer 500 as shown in FIG. 5A. The holes can further be extended into the substrate 504. This approach can be applied to any embodiment, including the ones shown in FIGS. 5B and 5C.

Although the radiation confinement in the microcavity increases with the number of holes, the coupling efficiency into the waveguide decreases. When a large number of holes are used on either side of the defect, there is barely any radiation leaking out into the waveguide. In order to couple light in and out of the microcavity, the number of holes on one side of the defect can be reduced without affecting significantly the confinement efficiency of the device. As a result, microcavities with both excellent field confinement and excellent coupling into the waveguide are fabricated.

Figure 6A:
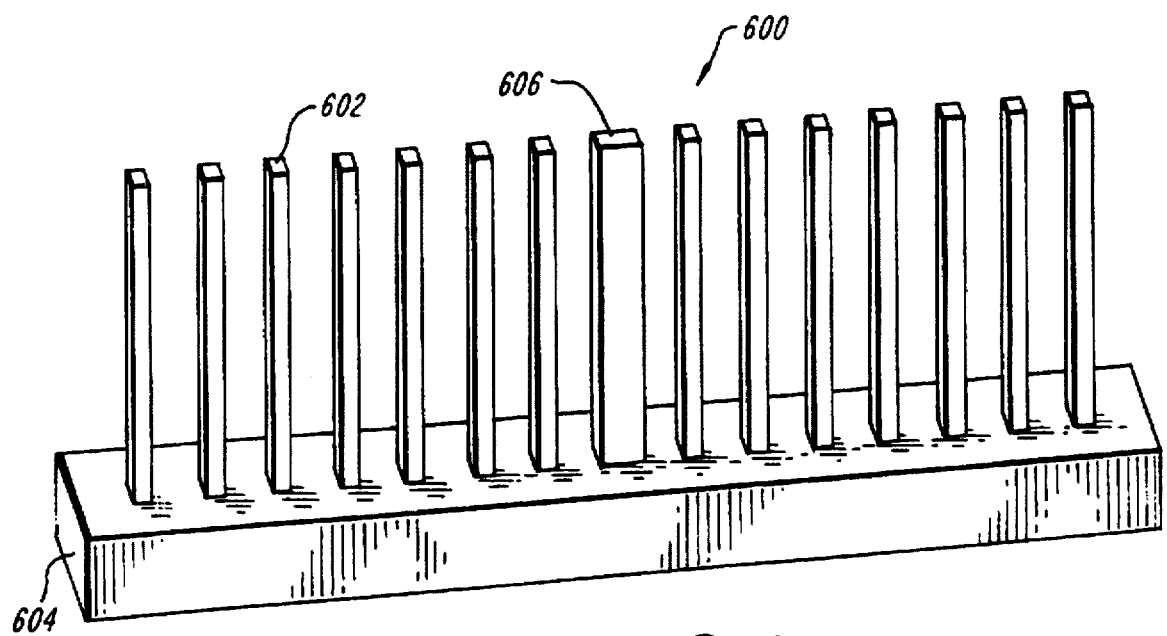
FIGS. 6A and 6B respectively show a waveguide microcavity configured from a periodic array of dielectric rods with an oversized intermediate rod, and a waveguide microcavity configured with a dielectric rib with holes disposed through the sides thereof.
Figure 6B:
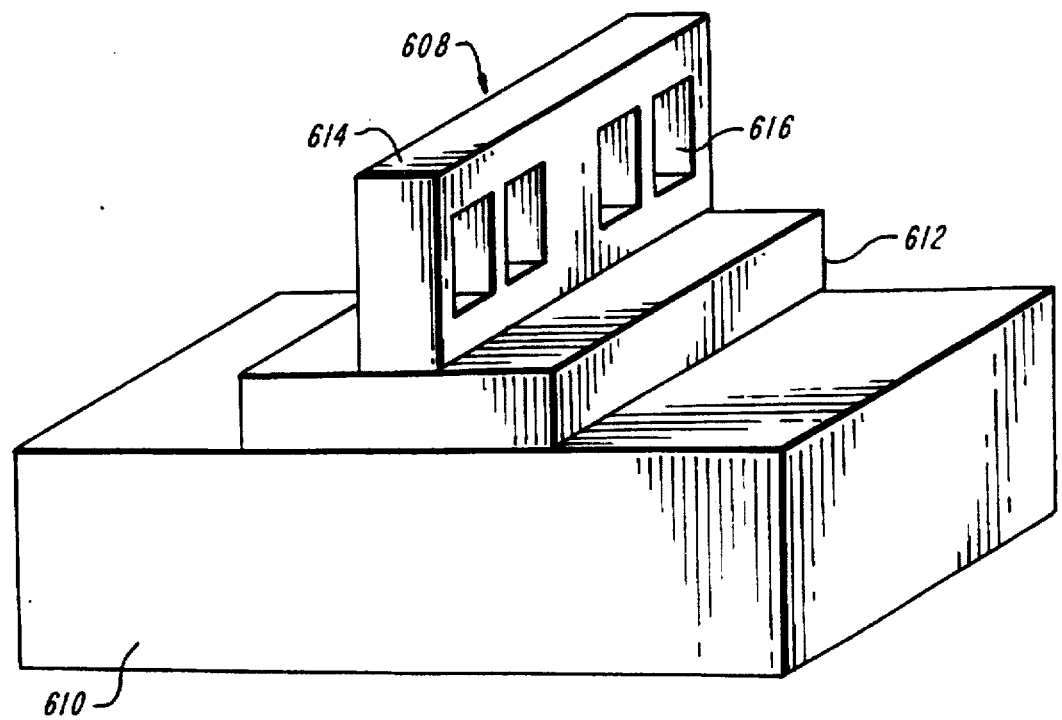

FIG. 6A shows another exemplary embodiment of a waveguide microcavity 600 which includes an array of long dielectric rods 602 fabricated on a substrate 604. The array of rods behaves like a one-dimensional periodic waveguide. Although the rods are illustrated with a square cross-section, it will be appreciated by those of skill in the art that the rods can be of any shape. The local defect is made of a single oversized rod 606, shown positioned in the center of the array. Radiation is strongly confined around this defect. However, stronger confinement can be achieved in the structure shown in FIG. 6B. The waveguide microcavity 608 of FIG. 6B is similar in structure to the embodiments shown in FIGS. 4 and 5 with a substrate 610 and dielectric layer 612, except that the waveguide dielectric rib 614 rests on its side at a 90° angle, with holes 616 going through parallel to the surface of the substrate. This structure is grown in stages by etching square grooves and by backfiling them with a material which is eventually removed after having grown the top part of the structure. Therefore, instead of ending up with circular holes, the holes 616 are square.

Lasing is achieved in all of the described embodiments simply by adding a gain medium in or in the vicinity of the defect. Since the field is very strongly confined around that area, the overlap of the resonant mode and the gain medium would be very large.

The waveguide microcavities described herein combine the best properties of microlasers while having the ability of being coupled directly into planar waveguides. The devices are interesting candidates for high-density high-speed planar integrated optical interconnects and could play a very significant role in systems such as optical computers.

The foregoing description has been set forth to illustrate the invention and is not intended to be limiting. Since modifications of the described embodiments incorporating the spirit and substance of the invention may occur to persons skilled in the art, the scope of the invention should be limited solely with reference to the appended claims and equivalents thereof.

What is claimed is:

1. A resonant microcavity comprising:

a substrate;

a planar dielectric waveguide configured along the surface of said substrate, said waveguide confining radiation propagating therewithin, in at least two dimensions in space by refractive index guiding through total internal reflection, said radiation defining a spectrum of electromagnetic modes;

a region in said waveguide having a one-dimensionally periodic variation of dielectric constant along the axial direction which is perpendicular to said at least two dimensions in space, thus creating a bandgap in said spectrum of electromagnetic modes; and a defect in said region which accommodates in all three dimensions spacial confinement of radiation in the vicinity of said defect, said spacial confinement resulting from a combination of the bandgap along said axial direction and refractive index guiding along said at least two dimensions in space, and accommodating the generation of at least one electromagnetic mode of radiation within said bandgap.

2. The microcavity of claim 1, wherein said waveguide is supported by a substrate, said substrate providing a refractive index contrast with said waveguide.

3. The microcavity of claim 2, wherein a dielectric layer is disposed between said waveguide and said substrate in order to minimize radiation losses into said substrate.

4. The microcavity of claim 1, wherein said waveguide is suspended in air in a bridge configuration between substrate supports such that said defect is surrounded by air.

5. The microcavity of claim 2, wherein said waveguide comprises an array of holes provided therein for periodicity.

6. The microcavity of claim 5, wherein said local defect comprises a separation of two of said holes by a distance larger than that which separates the remaining holes in said array.

7. The microcavity of claim 6, wherein said holes are disposed perpendicular with respect to the surface of said substrate so as to produce an electromagnetic mode localized around said defect.

8. The microcavity of claim 7, wherein a dielectric layer is disposed between said waveguide and said substrate, said holes extending through said waveguide and into said dielectric layer in order to minimize radiation losses into said substrate.

9. The microcavity of claim 5, wherein said holes are disposed parallel with respect to the surface of said substrate so as to produce an electromagnetic mode localized around said defect.

10. The microcavity of claim 2, wherein said waveguide comprises an array of rods extending therefrom for periodicity.

11. The microcavity of claim 10, wherein said local defect comprises a rod of a different size or dielectric constant in said array which produces an electromagnetic mode localized around said defect.

12. A resonant microcavity which exhibits an electromagnetic mode for use in a microlaser, comprising:

a substrate;

a planar dielectric waveguide configured along the surface of said substrate, said waveguide confining radiation generated therewithin, in at least two dimensions in space by refractive index guiding through total internal reflection, said radiation defining a spectrum of electromagnetic modes, said waveguide including a region having a one-dimensionally periodic variation of dielectric constant along its axial direction which is perpendicular to said at least two dimensions in space, thus defining a bandgap in said spectrum of electromagnetic modes; and a local defect disposed in said region of said dielectric waveguide which accommodates in all three dimensions spacial confinement of radiation in the vicinity of said defect, said spacial confinement resulting from a combination of the bandgap along said axial direction and refractive index guiding along said at least two dimensions in space, and accommodating the generation of at least one electromagnetic mode of radiation within said bandgap.

13. The microcavity of claim 12, wherein said waveguide is supported by a substrate, said substrate providing a refractive index contrast with said waveguide.

14. The microcavity of claim 13, wherein a dielectric layer is disposed between said waveguide and said substrate in order to minimize radiation losses into said substrate.

15. The microcavity of claim 12, wherein said waveguide is suspended in air in a bridge configuration between substrate supports such that said local defect is surrounded by air.

16. The microcavity of claim 13, wherein said waveguide comprises an array of holes provided therein for periodicity.

17. The microcavity of claim 16, wherein said local defect comprises a separation of two of said holes by a distance larger than that which separates the remaining holes in said array.

18. The microcavity of claim 17, wherein said holes are disposed perpendicular with respect to the surface of said substrate so as to produce said electromagnetic mode localized around said local defect.

19. The microcavity of claim 18, wherein a dielectric layer is disposed between said waveguide and said substrate, said holes extending through said waveguide and into said dielectric layer in order to minimize radiation losses into said substrate.

20. The microcavity of claim 16, wherein said holes are disposed parallel with respect to the surface of said substrate so as to produce said electromagnetic mode localized around said local defect.

21. The microcavity of claim 13, wherein said waveguide comprises an array of rods extending therefrom for periodicity.

22. The microcavity of claim 21, wherein said local defect comprises a rod of different size or dielectric constant in said array which produces said electromagnetic mode localized around said local defect.

23. A method of enhancing radiation confinement within a resonant microcavity and minimizing radiation losses into an associated substrate, said method comprising:

configuring said microcavity within a planar dielectric waveguide which is constructed along the surface of said substrate, said waveguide confining radiation generated therewithin, in at least two dimensions in space by refractive index guiding through total internal reflection, said radiation defining a spectrum of electromagnetic modes;

providing a region in said waveguide having a one-dimensionally periodic variation of dielectric constant along the axial direction which is perpendicular to said at least two dimensions in space, thus creating a bandgap in said spectrum of electromagnetic modes;

providing a local defect in said region which accommodates in all three dimensions spacial confinement of radiation in the vicinity of said defect which results from a combination of the bandgap along said axial direction and refractive index guiding along said at least two dimensions in space, so as to generate at least one electromagnetic mode within said bandgap; and increasing the refractive index contrast between said microcavity and said substrate.

24. The method of claim 23, wherein said step of increasing comprises suspending said microcavity in air in a bridge configuration so that said microcavity is surrounded by air.

25. The method of claim 23, wherein said step of increasing comprises providing a dielectric layer between said waveguide and said substrate.

26. The method of claim 23, wherein said waveguide comprises an array of holes therein for periodicity.

27. The method of claim 26, wherein said step of increasing comprises increasing the number of holes in said array.

28. The method of claim 23, wherein said step of increasing comprises increasing the depth of each hole of an array of holes provided in said substrate for periodicity into said dielectric layer.

29. A method of producing a resonant microcavity with enhanced radiation confinement, comprising:

providing a substrate;

forming a periodic waveguide on and parallel to the plane of said substrate;

forming a local defect in said periodic waveguide which accommodates spacial confinement of radiation generated within said waveguide around said defect;

removing said substrate from beneath said local defect so as to produce a bridge configuration in which said defect is surrounded by air.

30. A resonant microcavity comprising:

a planar periodic dielectric waveguide; and a defect in said periodic dielectric waveguide which accommodates spacial confinement of radiation generated within said waveguide around said defect, wherein said waveguide is suspended in air in a bridge configuration between substrate supports such that said defect is surrounded by air.

31. A resonant microcavity which exhibits an electromagnetic mode for use in a microlaser, comprising:

a planar one-dimensionally periodic dielectric waveguide which confines radiation generated therewithin along all three dimensions in space, said waveguide having a periodic variation of dielectric constant along its axial direction; and a local defect disposed in said periodic dielectric waveguide which accommodates spacial confinement of radiation around said defect, wherein said waveguide is suspended in air in a bridge configuration between substrate supports such that said local defect is surrounded by air.

32. A method of enhancing radiation confinement within a resonant microcavity and minimizing radiation losses into an associated substrate, said microcavity configured within a planar periodic dielectric waveguide including a local defect which exhibits spacial radiation confinement, said method comprising:

increasing the refractive index contrast between said microcavity and said substrate, wherein said step of increasing comprises suspending said microcavity in air in a bridge configuration so that said microcavity is surrounded by air.

* * * * *